United States Patent
Chang (10) Patent No.: US 6,908,854 B2
(45) Date of Patent: Jun. 21, 2005

(54) METHOD OF FORMING A DUAL-LAYER RESIST AND APPLICATION THEREOF

(75) Inventor: Ching-Yu Chang, Ilai (TW)

(73) Assignee: Macronix International Co., Ltd., Hsin-Chu (TW)

( * ) Notice: Subject to any disclaimer, the term of this patent is extended or adjusted under 35 U.S.C. 154(b) by 0 days.

(21) Appl. No.: 10/715,413

(22) Filed: Nov. 19, 2003

(65) Prior Publication Data

US 2004/0180528 A1 Sep. 16, 2004

(30) Foreign Application Priority Data

Mar. 12, 2003 (TW) ........................................ 92105340 A (51) Int. Cl.⁷ ............................................. H01L 21/4763
(52) U.S. Cl. ........................ 438/637; 438/638; 438/639; 438/761; 438/948; 438/949
(58) Field of Search ................................ 438/625, 629, 438/634, 636–640, 706, 745, 761, 782, 948, 949

(56) References Cited

U.S. PATENT DOCUMENTS 6,136,723 A * 10/2000 Nagase ........................ 438/725
6,242,344 B1 * 6/2001 Koh et al. ................... 438/638
6,774,043 B2 * 8/2004 Yamaguchi et al. ......... 438/705

* cited by examiner

*Primary Examiner*—Asok Kumar Sarkar
(74) *Attorney, Agent, or Firm*—Birch, Stewart, Kolasch & Birch, LLP (57) ABSTRACT

A method of forming a dual-layer resist and application thereof. With respect to the method of forming a dual-layer resist, first, a patterned first resist layer is formed on a substrate. Next, the first resist layer is cured so that the first resist layer does not dissolve in a resist solvent. Finally, a patterned second resist layer is formed on the cured first resist layer. The method of forming a dual-layer resist can be applied to mask ROM coding, hole formation and a dual damascene structure.

5 Claims, 13 Drawing Sheets

FIG. 1A

PRIOR ART

FIG. 1B

PRIOR ART

FIG. 2A

PRIOR ART

FIG. 2B

PRIOR ART

FIG. 3A

PRIOR ART

FIG. 3B

PRIOR ART

METHOD OF FORMING A DUAL-LAYER RESIST AND APPLICATION THEREOF

BACKGROUND OF THE INVENTION

This Nonprovisional application claims priority under 35 U.S.C. §119(a) on Patent Application No(s). 092105340 filed in TAIWAN on Mar. 12, 2003, the entire contents of which are hereby incorporated by reference.

1. Field of the Invention

The present invention relates to a method of forming a dual-layer resist and application thereof and in particular to a method of forming a patterned resist layer on another patterned resist layer.

2. Description of the Related Art

Figure 1A:
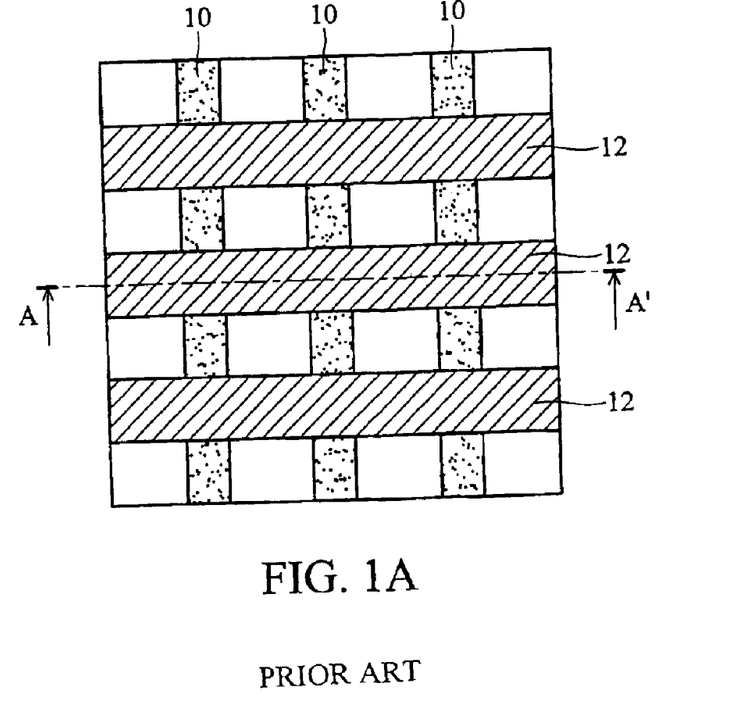
FIG. 1A is a schematic top view of an NMOS in a memory cell when the NMOS is formed.
Figure 1B:
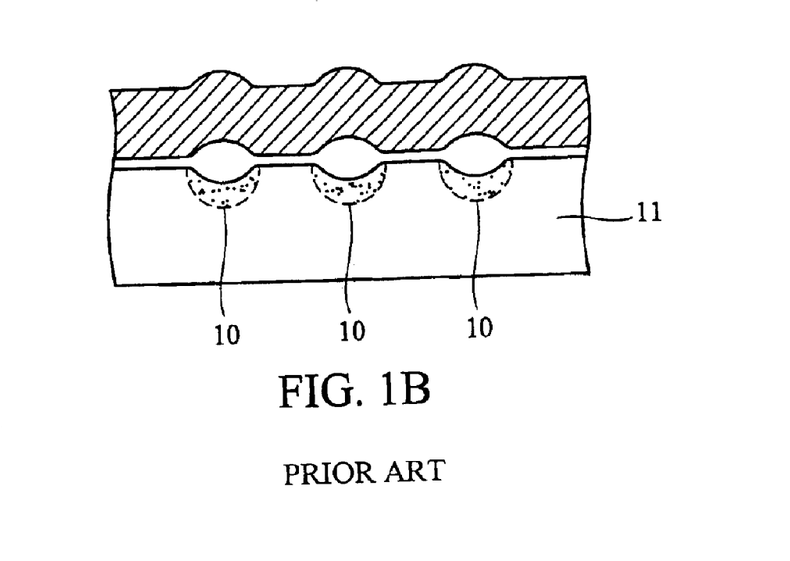
FIG. 1B shows a schematic cross section along line AA' in FIG. 1A.

As the size of memory cells of mask read only memory devices is reduced, defining a code implantation area in a memory cell using a single mask and single photolithography process is more difficult. Thus, a manufacturing process employing two masks and two photolithography processes has developed. FIG. 1A is a schematic top view showing formation of an NMOS in a memory cell and FIG. 1B shows a schematic cross section along line AA' in FIG. 1A. Buried bit lines 10 and word lines 12 are staggered and the position of a word line between every two buried bit lines acts as an NMOS. When a coding-related process is performed, a hard mask layer 14 (such as silicon dioxide) is first deposited, then, referring to FIGS. 2A and 2B, a photolithography process is performed (using a pre-code mask) to roughly form parallel resist lines 16 on the buried bit lines. Next, part of the hard mask 14 not shielded by the resist lines 16 is removed, and the resist lines 16 are then removed. Referring to FIGS. 3A and 3B another resist layer 18 is then formed using another photolithography process (using a code mask) to define memory cells for code implantation. The logic state of the area not shielded by the resist layer 18 and the hard mask 14 will be determined by the subsequent ion implantation process.

As is known from the preceding description, after an NMOS of a memory cell is formed and before the coding is accomplished, there are at least two photolithography processes, one deposition process, one etching process, one resist removal process, and one ion implantation process. Such a manufacturing process is costly and complicated but necessary, because if a subsequent resist layer is directly coated on the previous resist layer, the defined pattern on the previous resist layer will change due to the dissolution of the previous resist layer in the solvent used in the subsequent resist layer. Therefore, a hard mask layer is required to transfer patterns.

SUMMARY OF THE INVENTION

Accordingly, an object of the invention is to provide a method of forming a dual-layer resist, wherein the formation of the second resist layer does not affect the first resist layer.

Another object of the invention is to provide an application of the dual-layer resist to greatly reduce the process cost.

According to the object mentioned above, the present invention provides a method of forming a dual-layer resist. First, a substrate is provided and a patterned first resist layer is formed on the substrate. Next, the first resist layer is cured so that the first resist layer does not dissolve in a resist solvent. Then, a patterned second resist layer is formed on the cured first resist layer.

The curing may be performed using ion implantation or plasma to change the surface properties of the first resist layer, so that the first resist layer does not dissolve in the resist solvent used for the second resist layer. Thus, two resist layers with different patterns can be superimposed and thus reduce the process cost.

The present invention also provides a method of coding a mask read only memory. First, a substrate having a mask read only memory array consisting of a plurality of memory cells is provided thereon. Next, a first resist layer having repetitive patterns to shield a partial area of each memory cell is formed. Then, the first resist layer is cured so that the first resist layer does not dissolve in a resist solvent. A patterned second resist layer is formed on the cured first resist layer to shield a partial area of the mask read only memory array. Finally, code implantation is performed to change the logic state of the memory cell not shielded by the second resist layer.

The present invention can also be applied to a method of forming contact holes or via holes. The method comprises the steps of: providing a substrate having a dielectric layer thereon; forming a first resist layer having substantially parallel first trench patterns on the dielectric layer; curing the first resist layer so that the first resist layer does not dissolve in a resist solvent; forming a second resist layer having substantially parallel second trench patterns on the cured first resist layer, wherein the second trench patterns are substantially perpendicular to the first trench patterns; and removing the dielectric layer under the intersections of the second trench patterns and the first trench patterns to form at least one hole.

The present invention also can be applied to a method of manufacturing a dual damascene structure. The method comprises the steps of: providing a substrate having a dielectric layer thereon; forming a first resist layer having a plurality of hole patterns on the dielectric layer; curing the first resist layer so that the first resist layer does not dissolve in a resist solvent; forming a second resist layer having a plurality of second trench patterns on the cured first resist layer; etching the dielectric layer using the first resist layer as a mask to transfer the hole patterns to the dielectric layer; and etching the first resist layer and the dielectric layer using the second resist layer as a mask to transfer the trench patterns to the dielectric layer.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Put simply, the object of the present invention is to form two patterned and directly-stacked resist layers on a substrate. The surface properties of the lower resist layer are changed by performing a resist treatment step so that its surface does not dissolve when exposed to the resist solvent used to coat the upper resist layer, thereby the lower resist layer is protected.

Figure 4A:
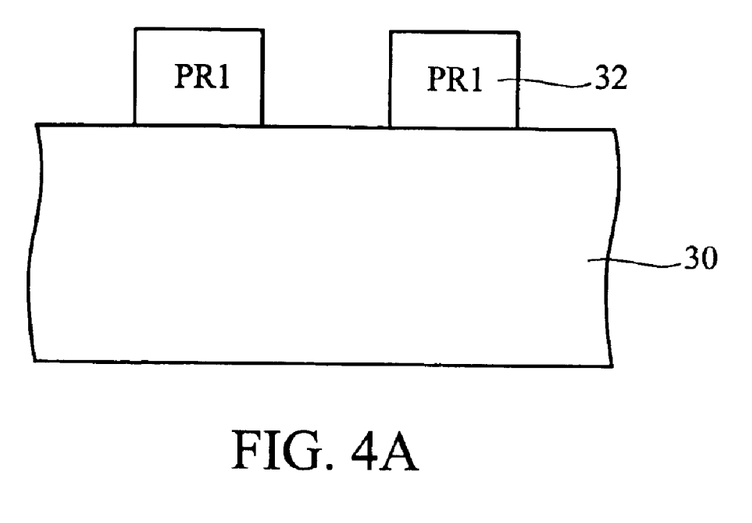
FIGS. 4A to 4C show schematic cross sections of the substrate of the dual-layer resist of the present invention during the manufacturing process.
Figure 4B:
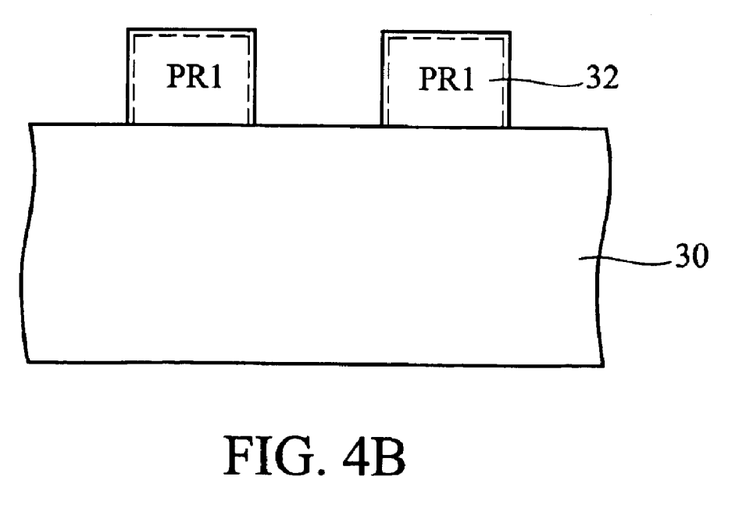
Figure 4C:
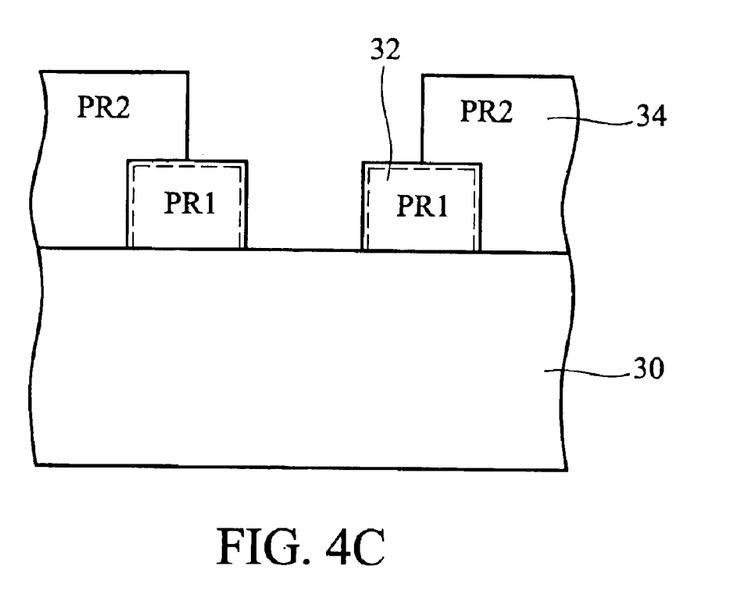

FIGS. 4A to 4C show schematic cross sections of the substrate of the dual-layer resist of the present invention during manufacture. Referring to FIG. 4A, the first step forms a patterned first resist layer 32 on a substrate 30. This can be accomplished by a general photolithography process. Referring to FIG. 4B, the second step is to cure the first resist layer 32 so that the surface of the first resist layer 32 is chemically altered and does not dissolve in a resist solvent. There are many methods for curing, for example, ion implantation of argon (Ar) or nitrogen into the first resist layer 32. The ion implantation can be performed with energy of 10 to 50 keV and a dose of $10^{13}$ to $10^{15}$ ions/cm$^2$. Another curing method is, for example, placing the substrate 30 and the first resist layer 32 in an environment of argon plasma, so that the surface properties of the first resist layer 32 will be changed by plasma. Referring to FIG. 4C, the next step is to form another patterned resist layer (the second resist layer 34). The second resist layer 34 can be directly coated, exposed and developed on the first resist layer 32 because the surface of the first resist layer 32 does not dissolve in a resist solvent. Thus, a dual-layer resist structure is formed, and may be followed by etching or ion implantation as desired.

There may be many applications for such a dual-layer resist structure. Three possible applications or examples are described in the following, all of which can achieve the goal of reduced process steps and cost.

EMBODIMENTS

Embodiment 1

The dual-layer resist structure of the present invention can be applied to the method of coding a mask read only memory (ROM).

First, referring to FIGS. 1A and 1B, a substrate 11 having a mask ROM array consisting of a plurality of memory cells thereon is provided. The mask ROM array includes a plurality of buried bit lines 10 composed of doped areas and a plurality of word lines 12 composed of polysilicon. The position of a word line 12 between every two buried bit lines 10 is a memory cell.

Figure 2A:
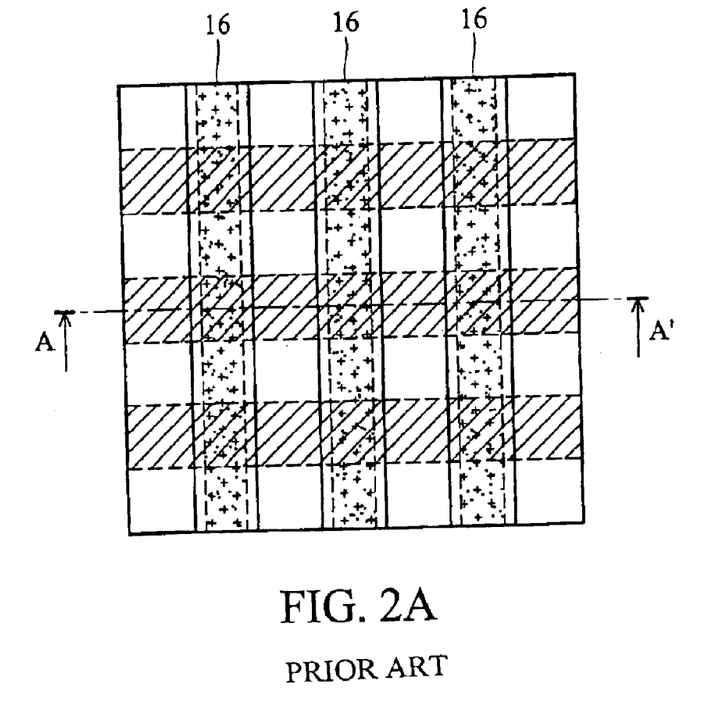
FIG. 2A is a schematic top view of the NMOS in FIG. 1A when a pre-code mask pattern is further disposed.
Figure 2B:
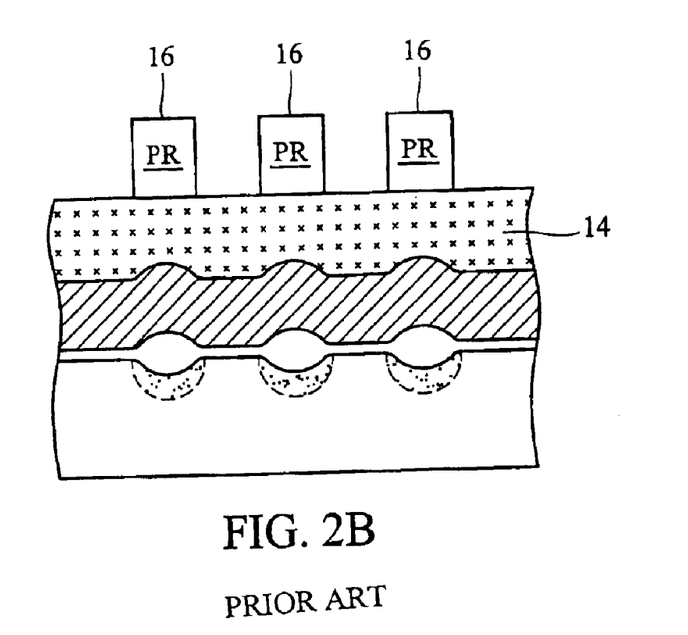
FIG. 2B shows a schematic cross section along line AA' in FIG. 2A when a hard mask is used in the practice of the invention.
Figure 3A:
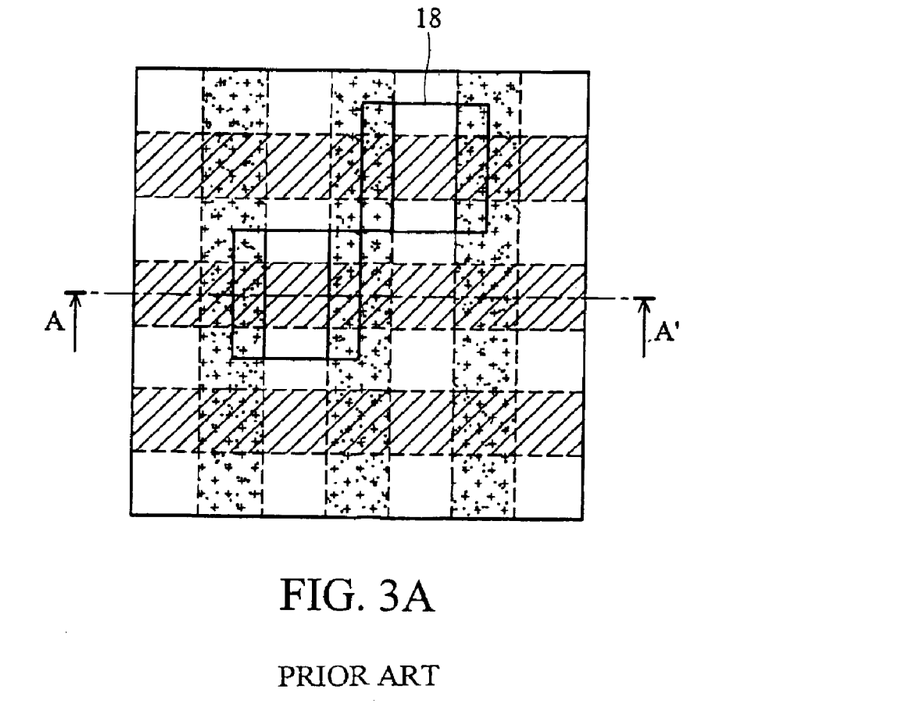
FIG. 3A is a schematic top view showing when a code mask pattern is further disposed in FIG. 2A.
Figure 3B:
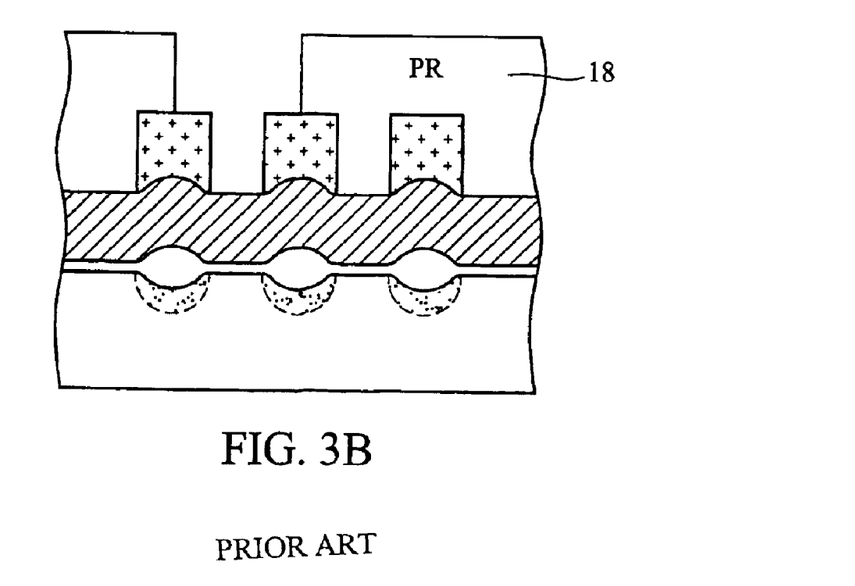
FIG. 3B shows a schematic cross section along line AA' in FIG. 3A when a hard mask is used in the practice of the invention.
Figure 5A:
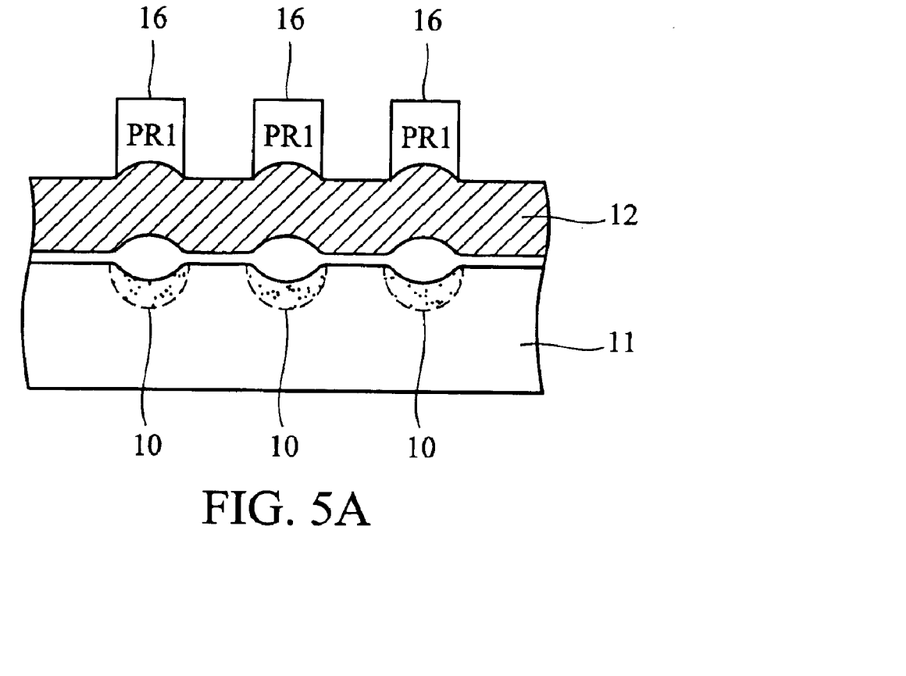
FIG. 5A shows a schematic cross section along line AA' in FIG. 2A in the practice of the invention of the present invention.

Next, referring to FIGS. 2A and 5A, FIG. 5A showing a schematic cross section along line AA' in FIG. 2A in the practice of the invention of the present invention, a first resist layer 16 with repeating patterns is formed on the mask ROM array to shield a partial area of each memory cell. FIGS. 2A and 5A show the first resist layer 16 after development in which a plurality of parallel lines directly adhere to the word lines 12 and shield the buried bit lines 10 in the mask ROM array.

Next, the surface of the first resist layer 16 is cured so that the first resist layer 16 does not dissolve in a resist solvent. The curing methods may be the same as those described above.

Figure 5B:
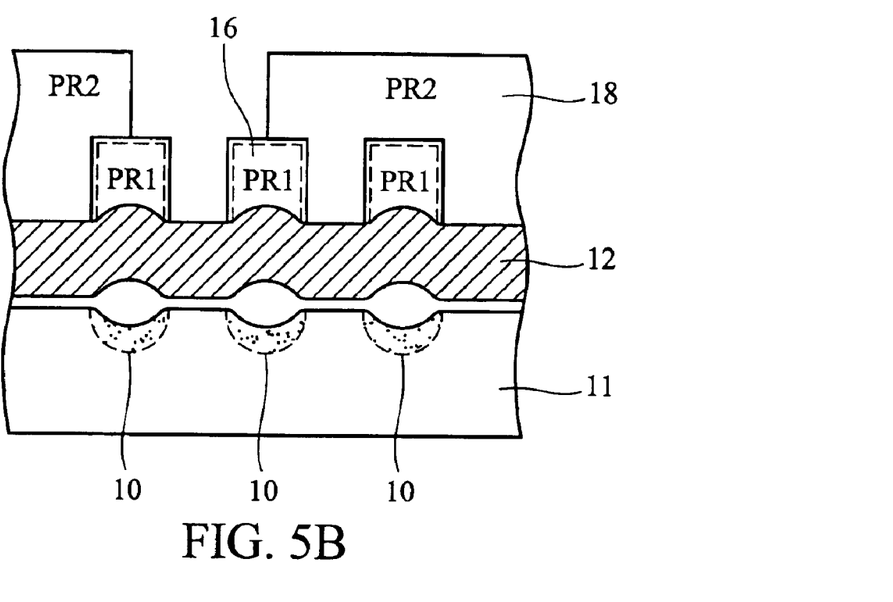
FIG. 5B shows a schematic cross section along line AA' in FIG. 3A in the practice of the invention of the present invention.

Next, referring to FIGS. 3A and 5B, FIG. 5B shows a schematic cross section along line AA' in FIG. 3A in the practice of the invention of the present invention, a patterned second resist layer 18 is formed on the cured first resist layer 16 to shield a partial area of the mask read only memory array. The pattern of the second resist layer 18 is designed according to coding requirements. For an individual memory cell, it could be in an opened or closed state to represent a logic value of 0 or 1.

Next, a code implantation process is performed to change the logic state of the memory cell not shielded by the second resist layer 18. For example, ion implantation is performed using boron ions. If each memory cell is an NMOS, the threshold voltage of the NMOS which has been treated by the ion implantation or which has not been shielded by the second resist layer 18 or the first resist layer 16 will increase.

As compared with the conventional coding methods using a hard mask, the coding method of the embodiment does not require formation of a hard mask layer, and only requires one resist removal process to remove both the first resist layer 16 and the second resist layer 18 after the code implantation process. The embodiment only requires two photolithography processes and one ion implantation process after the NMOS of the memory cells is formed and before the coding is accomplished. Thus, the process complexity and the corresponding cost are both greatly reduced.

Embodiment 2

The present invention can be applied to the method of forming holes (contact holes or via holes) in a semiconductor process.

The holes on semiconductor chips are mostly formed in dielectric layers (for example, silicon dioxide or silicon nitride). Thus, the first step to form holes is to provide a substrate having a dielectric layer thereon.

Figure 6A:
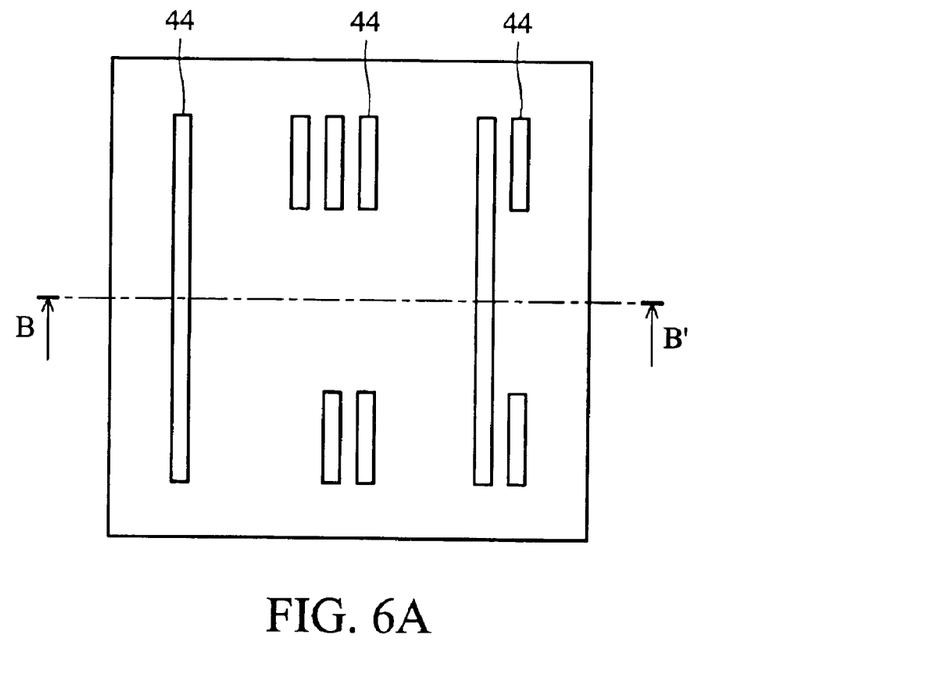
FIG. 6A is a schematic top view of a patterned first resist layer in the practice of the invention of the present invention.
Figure 6B:
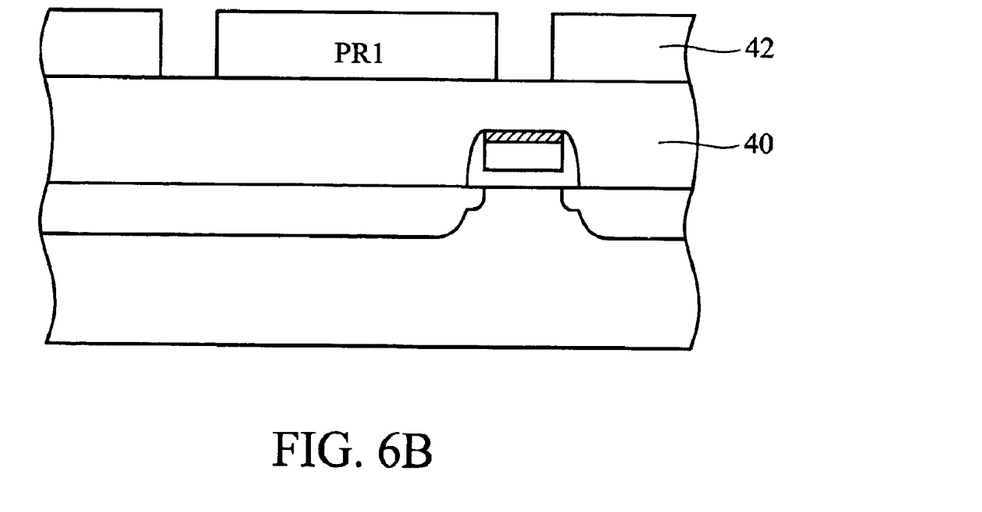
FIG. 6B shows a schematic cross section of a chip along line BB' in FIG. 6A.

Next, referring to FIGS. 6A and 6B, a first resist layer 42 having substantially parallel first trench patterns 44 is formed on the dielectric layer 40. FIG. 6A is a schematic top view of a patterned first resist layer in the practice of the invention of the present invention and FIG. 6B shows a schematic cross section of a chip along line BB' in FIG. 6A.

Next, the first resist layer 42 is cured so that the first resist layer 42 does not dissolve in a resist solvent. The curing methods may be the same as those described above.

Figure 7A:
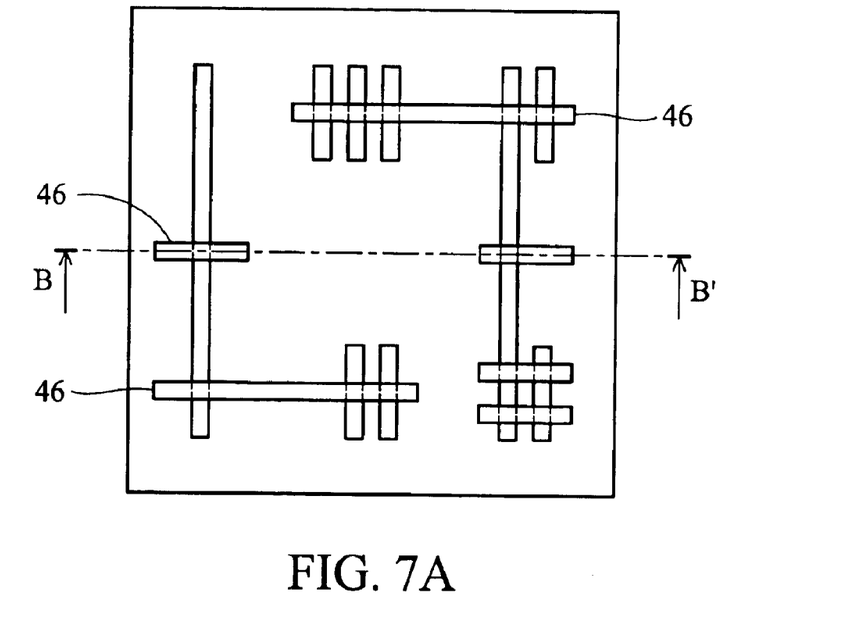
FIG. 7A is a schematic top view of a patterned second resist layer in the practice of the invention of the present invention.
Figure 7B:
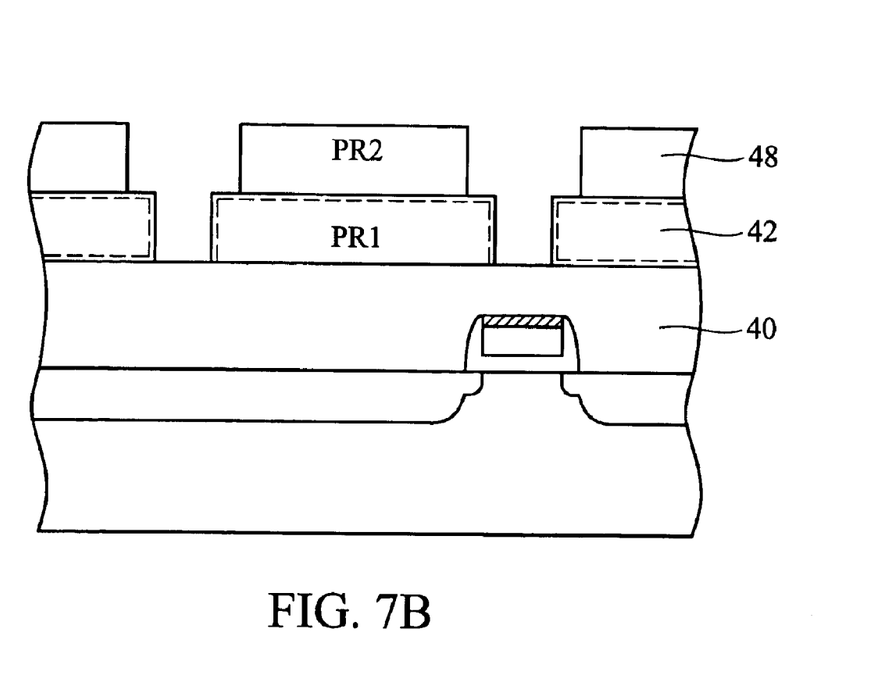
FIG. 7B shows a schematic cross section of a chip along line BB' in FIG. 7A.

Referring to FIGS. 7A and 7B, FIG. 7A is a schematic top view of a patterned second resist layer in the practice of the invention of the present invention and FIG. 7B shows a schematic cross section of a chip along line BB' in FIG. 7A. A second resist layer 48 having substantially parallel second trench patterns 46 is formed on the cured first resist layer 42. The second trench patterns 46 are substantially perpendicular to the first trench patterns 44.

Figure 8:
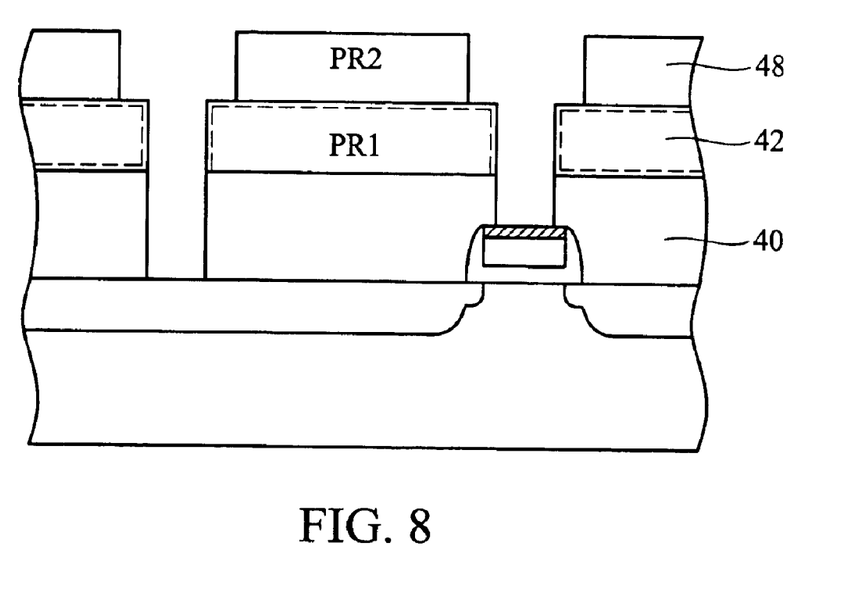
FIG. 8 is a schematic cross section of FIG. 7A after the hole etching is completed.

Next, referring to FIG. 8, etching is performed to remove the dielectric layer 40 under the intersections of the second trench patterns 46 and the first trench patterns 44 to form at least one hole. An anisotropic etching process is performed using the first resist layer and the second resist layer as a mask to remove part of the dielectric layer 40 and stop at one or more certain layers. In FIG. 8, the etching process is stopped at the top of the gate, source and drain, to form a contact hole for the underneath element (NMOS).

As is known in the art, if a resist layer having hole patterns is desired to be formed directly, it is rather difficult to form the hole by exposing and developing the resist when the diameter of the hole to be formed is approaching or less than the resolution limit of the exposure machine. Conversely, under the same resolution limit, forming a trench pattern is much easier than forming a hole. Therefore, the embodiment employs two photolithography processes to form a hole. One trench pattern is formed in each photolithography process. The position of the hole is defined by the intersection of the two trench patterns. Such a method can overcome the difficulty encountered by the conventional technologies to form a small diameter hole. Moreover, compared with the method of forming a resist layer having a hole pattern in one photolithography process, the process according to the present invention only requires one additional photolithography process and one additional resist curing process, thus the process cost is not significantly increased.

Embodiment 3

The present invention can be applied to the method of forming a dual damascene structure in a semiconductor process.

A general dual damascene structure is used in the interconnection line. Most dual damascene structures are formed at a dielectric layer 52 on a semiconductor substrate 50. The dielectric layer 52 can be silicon dioxide, silicon nitride, or a multilayered composite dielectric layer.

Figure 9A:
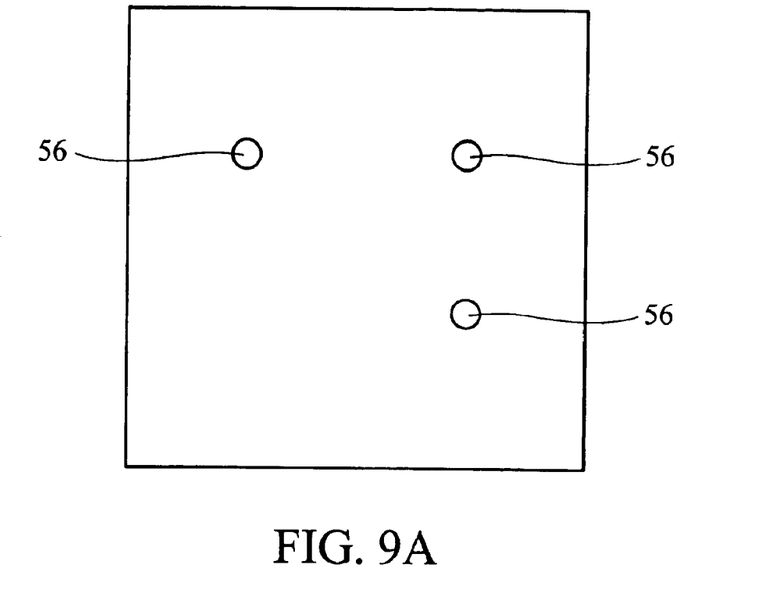
FIG. 9A is a schematic top view of a first resist layer having holes.
Figure 9B:
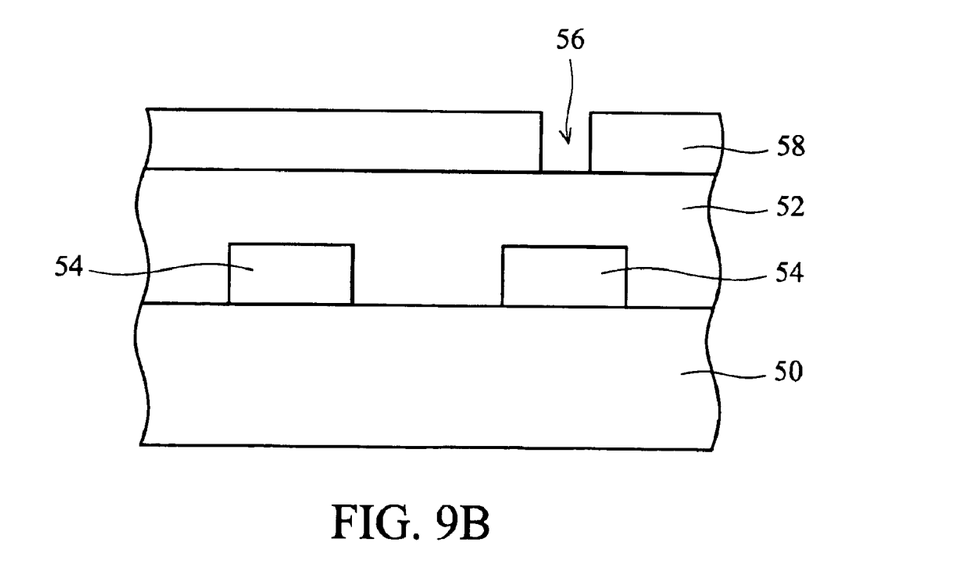
FIG. 9B shows a schematic cross section of a chip in FIG. 9A.

When the present invention is used to manufacture a dual damascene structure, first, a first resist layer 58 having a plurality of hole patterns 56 is formed on a dielectric layer 52, referring to FIGS. 9A and 9B. FIG. 9A is a schematic top view of a first resist layer 58 having hole patterns 56 and FIG. 9B shows a schematic cross section of a chip in FIG. 9A. The first resist layer 58 defines the positions of via holes to be formed on the dielectric layer 52.

Figure 10:
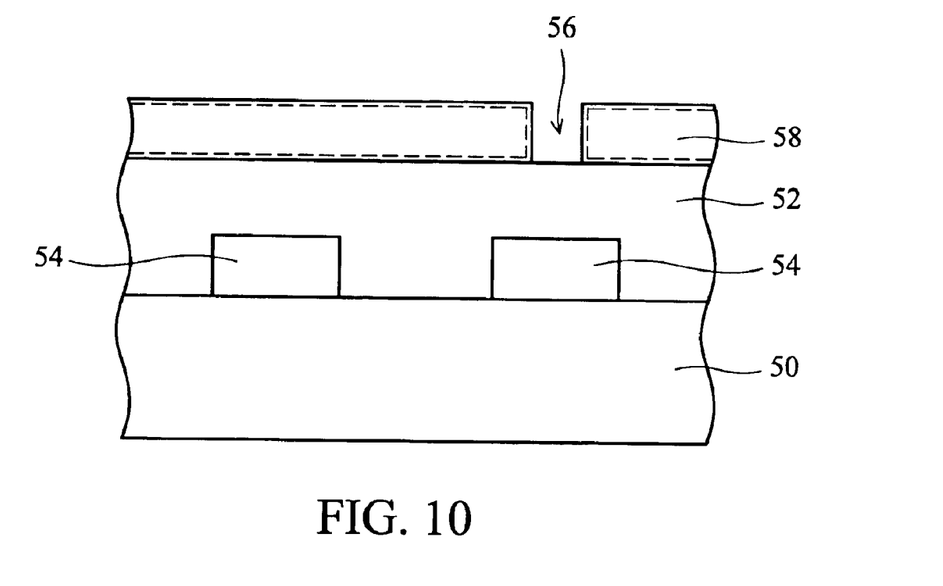
FIG. 10 shows a schematic view of the resist layer in FIG. 9B after curing.

Next, the first resist layer 58 is cured so that the first resist layer 58 does not dissolve in a resist solvent, referring to FIG. 10. The curing methods may be the same as those described above.

Figure 11A:
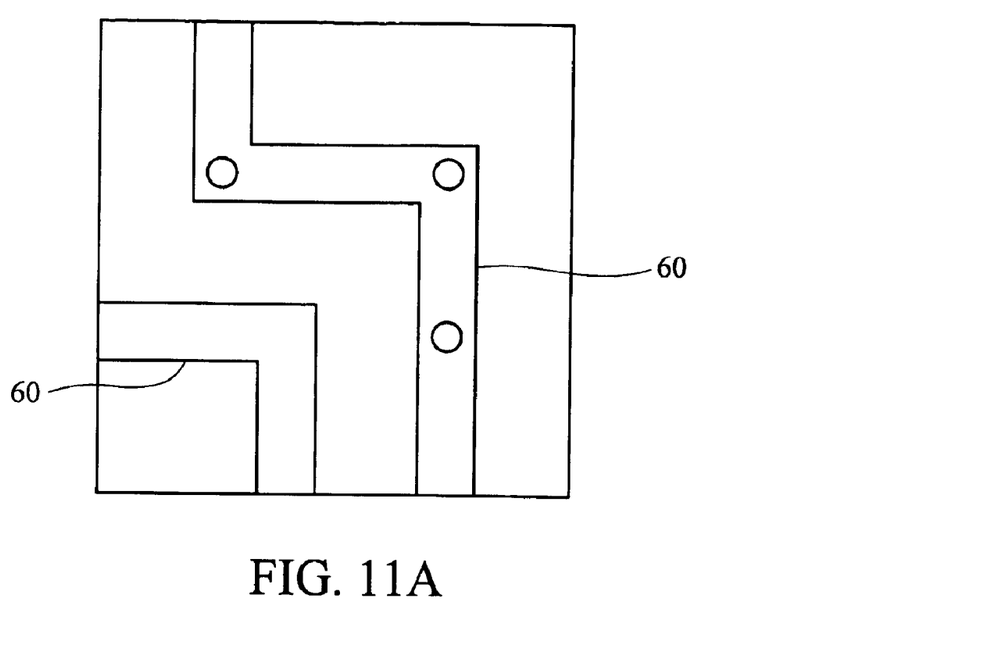
FIG. 11A is a schematic top view of FIG. 10 after a second resist layer is formed on the first resist layer.
Figure 11B:
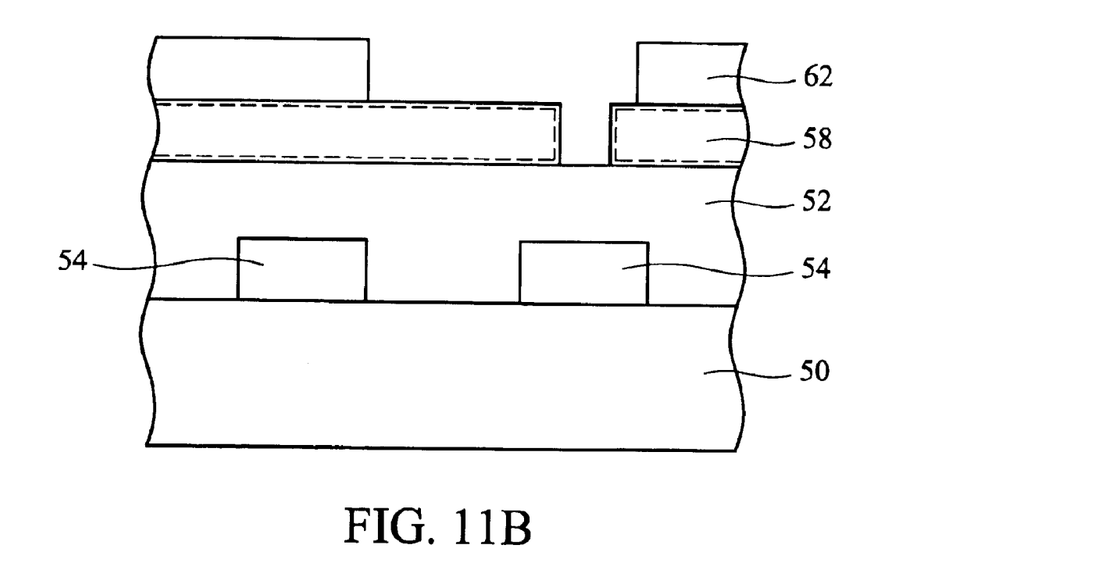
FIG. 11B shows a schematic cross section of a chip showed in FIG. 11A.

Next, a second resist layer 62 having a plurality of trench patterns 60 on the cured first resist layer 58, referring to FIGS. 11A and 11B. FIG. 11A is a schematic top view of FIG. 10 after a second resist layer 62 is formed on the first resist layer 58 and FIG. 11B shows a schematic cross section of a chip shown in FIG. 11A. The second resist layer 62 defines the positions of metal lines to be formed on the surface of the dielectric layer 52.

Next, the dielectric layer 52 is etched using the first resist layer 58 as a mask to transfer the hole patterns 56 to the dielectric layer 52. During the etching, the underlying metal layer 54 can be used as a stop layer for controlling the process machine. By properly adjusting the parameters of the etching machine, the first, and the second resist layers (58 and 62) are not removed as far as possible, but the exposed dielectric layer 52 is removed.

Next, the first resist layer 58 and the dielectric layer 50 are etched using the second resist layer 62 as a mask to transfer the trench patterns 60 to the dielectric layer 52. During etching, the first resist layer 58 not shielded by the second resist layer 62 is first removed by end point. At the same time, the second resist layer 62 can be removed due to the same material being used for the first resist layer 58 and the second resist layer 62, but the trench patterns 60 of the second resist layer 62 still remain due to the thickness difference of the resist. If the dielectric layer 52 is a single material, the certain thickness of the dielectric layer 52 not shielded by the second resist layer 62 is removed by time-mode for a constant etching time period. Thus, the trench patterns 60 are transferred onto the dielectric layer 52. If the dielectric layer 52 is a composite material (having a plurality of layers of different materials), the etching may be stopped at a position in the dielectric layer 52 by end point to achieve the transfer of the trench patterns 60 onto the dielectric layer 52.

It is noted that because hole pattern transfer and trench pattern transfer are two continuous etching steps, they can be performed in one etching machine, thus simplifying the manufacturing process.

Figure 12:
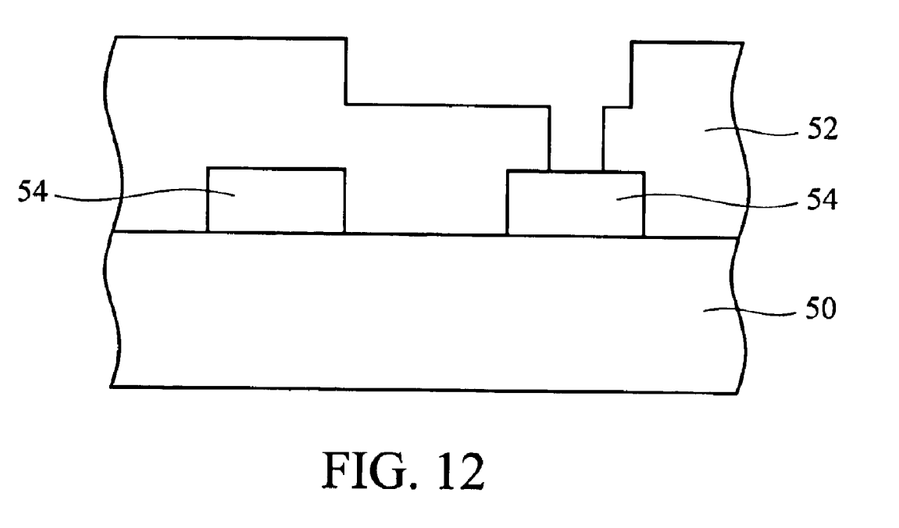
FIG. 12 is a schematic view showing the completion after etching and removing resist layer in FIGS. 11A and 11B.

Referring to FIG. 12, after the resist is removed, the dual damascene structure is accomplished, wherein the lower part of the dielectric layer has holes and the upper part of the dielectric layer has trenches.

In the method of forming a dual-layer resist of the present invention, two patterned resist layer are stacked together without other layers or materials interposed therebetween, and thus the method has the advantage of a simplified manufacturing process. When the method is applied to the coding method of a mask ROM, process cost is greatly reduced. When the method is applied to form contact holes or via holes, holes with smaller diameter than those formed by the conventional techniques can be formed. When the method is applied to dual damascene manufacture, the conventional two steps of using two etching machines to transfer hole patterns and trench patterns respectively can be merged and performed using only one etching machine. Therefore, the present invention has remarkable potential for practical application.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of forming holes, comprising the steps of:
   providing a substrate having a dielectric layer thereon;
   forming a first resist layer having substantially parallel first trench patterns on the dielectric layer;
   curing the first resist layer so that the first resist layer does not dissolve in a resist solvent;
   forming a second resist layer having substantially parallel second trench patterns on the cured first resist layer, wherein the second trench patterns are substantially perpendicular to the first trench patterns; and
   removing the dielectric layer under the intersections of the second trench patterns and the first trench patterns to form at least one hole.

2. The method as claimed in claim 1, wherein the step of curing the first resist layer is performed by ion implantation of argon or nitrogen into the first resist layer.

3. The method as claimed in claim 2, wherein the ion implantation is performed using an energy of 10 to 50 keV and a dose of $10^{13}$ to $10^{15}$ ions/cm$^2$.

4. The method as claimed in claim 1, wherein the step of curing the first resist layer is performed using argon plasma.

5. The method as claimed in claim 1, wherein the dielectric layer is mainly silicon dioxide.

* * * * *